(12) United States Patent
Oikawa (10) Patent No.: US 8,907,407 B2
(45) Date of Patent: Dec. 9, 2014

(54) SEMICONDUCTOR DEVICE COVERED BY FRONT ELECTRODE LAYER AND BACK ELECTRODE LAYER

(75) Inventor: Takahiro Oikawa, Gunma (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 121 days.

(21) Appl. No.: 12/570,209

(22) Filed: Sep. 30, 2009

(65) Prior Publication Data

US 2010/0013008 A1 Jan. 21, 2010

(30) Foreign Application Priority Data

Oct. 3, 2008 (JP) ................................. 2008-258242
Oct. 3, 2008 (JP) ................................. 2008-258243

(51) Int. Cl.
*H01L 29/78* (2006.01)
*H01L 21/283* (2006.01)
*H01L 29/417* (2006.01)
*H01L 29/45* (2006.01)
*H01L 23/00* (2006.01)

(52) U.S. Cl.
CPC ...... *H01L 29/7813* (2013.01); *H01L 29/41741* (2013.01); *H01L 29/456* (2013.01); *H01L 29/7809* (2013.01); *H01L 24/06* (2013.01); H01L 2224/16 (2013.01); H01L 2924/01078 (2013.01); H01L 2924/01079 (2013.01); *H01L 24/13* (2013.01); H01L 2224/0346 (2013.01); H01L 2224/0347 (2013.01); H01L 2224/0391 (2013.01); H01L 2224/05139 (2013.01); H01L 2224/05147 (2013.01); H01L 2224/05155 (2013.01); H01L 2224/05567 (2013.01); H01L 2224/05644 (2013.01); H01L 2224/0603 (2013.01); H01L 2224/06051 (2013.01); H01L 2224/06181 (2013.01); H01L 2224/13007 (2013.01); H01L 2224/13022 (2013.01); H01L 2224/94 (2013.01); H01L 2924/3511 (2013.01); H01L 2224/131 (2013.01); H01L 2224/16227 (2013.01); H01L 2224/16225 (2013.01)
USPC ............. 257/329; 257/E21.159; 257/E21.41; 257/E29.262; 438/652; 438/268

(58) Field of Classification Search
CPC .............................. H01L 29/78; H01L 21/283
USPC ............. 257/329, E21.159, E21.41, E29.262; 438/652, 268
See application file for complete search history.

(56) References Cited

U.S. PATENT DOCUMENTS 4,607,270 A 8/1986 Iesaka
4,941,030 A * 7/1990 Majumdar .................... 257/378

(Continued)

FOREIGN PATENT DOCUMENTS

DE 10333556 3/2005
EP 1 139 433 10/2001

(Continued)

OTHER PUBLICATIONS

European search report directed to application EP07005474.7 mailed on Aug. 4, 2008; 8 pages.

(Continued)

*Primary Examiner* — Thao X Le
*Assistant Examiner* — Sheng Zhu
(74) *Attorney, Agent, or Firm* — Abel Law Group, LLP (57) ABSTRACT

The invention prevents a semiconductor device from warping due to heat when it is used. The invention also prevents a formation defect such as peeling of a resist layer used as a plating mask and a formation defect of a front surface electrode. A source pad electrode connected to a source region is formed on a front surface of a semiconductor substrate forming a vertical MOS transistor. A front surface electrode is formed on the source pad electrode by a plating method using a resist layer having openings as a mask. The semiconductor substrate formed with the front surface electrode is thinned by back-grinding. A back surface electrode connected to a drain region is formed on the back surface of the semiconductor substrate. The front surface electrode and the back surface electrode are made of metals having the same coefficients of linear expansion, preferably copper. The front surface electrode and the back surface electrode preferably have the same thicknesses or almost the same thicknesses.

20 Claims, 8 Drawing Sheets

(56) References Cited

U.S. PATENT DOCUMENTS

| | | | |
|---|---|---|---|
| 5,289,019 A | 2/1994 | Terashima et al. | |
| 5,496,755 A | 3/1996 | Bayraktaroglu | |
| 5,698,453 A | 12/1997 | Green et al. | |
| 6,018,176 A * | 1/2000 | Lim | 257/302 |
| 6,054,748 A | 4/2000 | Tsukuda et al. | |
| 6,081,006 A | 6/2000 | Nelson | |
| 6,229,196 B1 * | 5/2001 | Shishido et al. | 257/617 |
| 6,297,155 B1 * | 10/2001 | Simpson et al. | 438/687 |
| 6,734,061 B2 * | 5/2004 | Hong et al. | 438/253 |
| 6,750,508 B2 * | 6/2004 | Omura et al. | 257/329 |
| 6,888,196 B2 | 5/2005 | Kobayashi | |
| 6,894,390 B2 * | 5/2005 | Schammler et al. | 257/738 |
| 6,955,932 B2 * | 10/2005 | Hovel et al. | 438/17 |
| 6,958,543 B2 * | 10/2005 | Nakayama | 257/758 |
| 6,979,861 B2 * | 12/2005 | Rodov et al. | 257/329 |
| 7,132,321 B2 | 11/2006 | Kub et al. | |
| 7,217,950 B2 | 5/2007 | Kaneko et al. | |
| 7,217,954 B2 * | 5/2007 | Kusumoto et al. | 257/77 |
| 7,462,541 B2 * | 12/2008 | Aida et al. | 438/270 |
| 7,750,377 B2 * | 7/2010 | Hoshino et al. | 257/263 |
| 7,932,583 B2 * | 4/2011 | Ruething et al. | 257/577 |
| 8,373,176 B2 * | 2/2013 | Tamaso | 257/77 |
| 2004/0082116 A1 | 4/2004 | Kub et al. | |
| 2005/0156283 A1 | 7/2005 | Tokuda et al. | |
| 2005/0218446 A1 | 10/2005 | Hierlemann et al. | |
| 2006/0022298 A1 * | 2/2006 | Shiraishi et al. | 257/509 |
| 2007/0138547 A1 | 6/2007 | Nakamura | |
| 2007/0215938 A1 | 9/2007 | Yanagida et al. | |
| 2008/0197361 A1 * | 8/2008 | Ueno | 257/77 |
| 2008/0230810 A1 * | 9/2008 | Yoshimura | 257/256 |
| 2009/0242934 A1 * | 10/2009 | Hu | 257/186 |

FOREIGN PATENT DOCUMENTS

| | | |
|---|---|---|
| EP | 1793426 | 6/2007 |
| JP | 62-63472 | 3/1987 |
| JP | 09-162395 | 6/1997 |
| JP | 2001-119023 | 4/2001 |
| JP | 2002-16266 | 1/2002 |
| JP | 2002-353452 | 12/2002 |
| JP | 2004-140067 | 5/2004 |
| JP | 2004-140101 | 5/2004 |
| JP | 2005-129652 | 5/2005 |
| JP | 2008-66694 | 3/2008 |

OTHER PUBLICATIONS

Yanagida et al., U.S. Office Action mailed Sep. 26, 2008, directed to U.S. Appl. No. 11/724,330; 11 pages.

Yanagida et al., U.S. Office Action mailed Dec. 21, 2007, directed to U.S. Appl. No. 11/724,330; 11 pages.

* cited by examiner

SEMICONDUCTOR DEVICE COVERED BY FRONT ELECTRODE LAYER AND BACK ELECTRODE LAYER

CROSS-REFERENCE OF THE INVENTION

This application claims priority from Japanese Patent Applications Nos. 2008-258242 and 2008-258243, the contents of which are incorporated herein by reference in their entireties.

BACKGROUND OF THE INVENTION

1. Field of the Invention

The invention relates to a semiconductor device and a method of manufacturing the same, particularly, a semiconductor device having electrodes on either side of a semiconductor substrate and a method of manufacturing the same.

2. Description of the Related Art

A power transistor is widely used as a switching element for power supply. A vertical MOS transistor in which a source-drain current flows in a vertical direction relative to a front surface of a semiconductor substrate is known as a kind of power transistor.

Figure 13A:
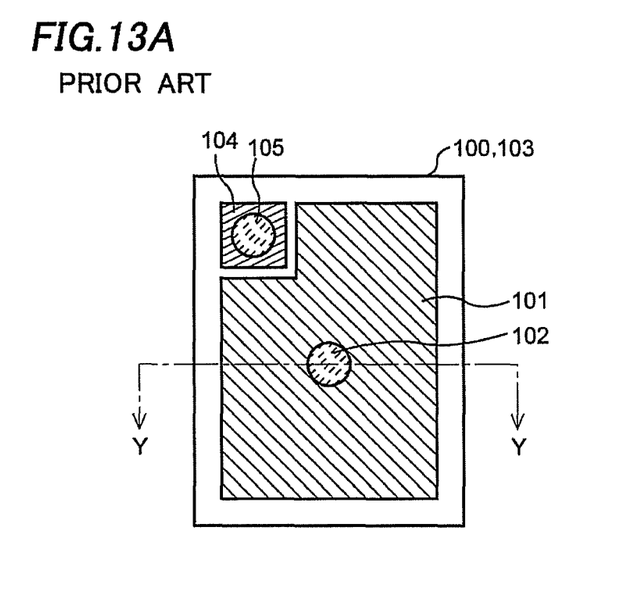
FIGS. 13A and 13B are a plan view and a cross-sectional view showing a conventional semiconductor device.
Figure 13B:
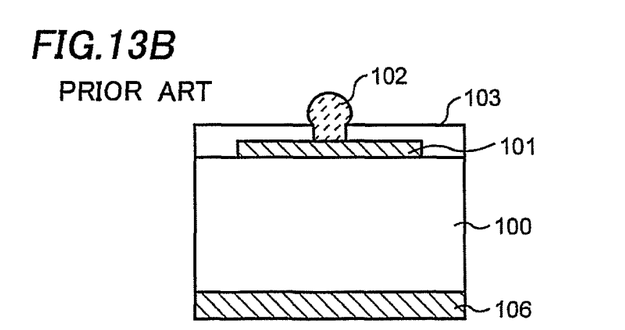

A vertical MOS transistor will be described referring to figures. FIG. 13A is a plan view of the vertical MOS transistor on the front surface side, and FIG. 13B is a cross-sectional view of FIG. 13A along line Y-Y.

A source electrode 101 and a gate electrode 104 are formed as front surface electrodes on the front surface of a semiconductor substrate 100, being connected to a source region and a gate (not shown) formed on the front surface. Bump electrodes 102, 105 for electrically connecting the source electrode 101 and the gate electrode 104 to a circuit board (not shown) (e.g. a printed board) are formed on the source electrode 101 and the gate electrode 104. The source electrode 101 and the gate electrode 104 are covered by a protection film 103, with the bump electrodes 102, 105 being exposed.

On the other hand, a drain electrode 106 as a back surface electrode is formed on the back surface of the semiconductor substrate 100, being connected to a drain region of the semiconductor substrate 100.

Such a vertical MOS transistor is described in Japanese Patent Application Publication No. 2008-66694.

However, the semiconductor substrate 100 formed with the vertical MOS transistor described above may warp when it is used. This is likely because stress applied to the interface between the semiconductor substrate 100 and the front surface electrodes and stress applied to the interface between the semiconductor substrate 100 and the back surface electrode are different when the front surface electrodes and the back surface electrode have different coefficients of linear expansion. The warping of the semiconductor substrate 100 may cause the protection film 103 or the bump electrodes 102, 105 to peel off and further the front surface electrodes or the back surface electrode to peel off. Since this warping of the semiconductor substrate 100 varies depending on changes in temperature of an environment, the repetition of the temperature change likely causes the protection film 103 and so on to peel off easily.

Furthermore, there is a need for enhancement of the current drive ability of the vertical MOS transistor described above. In order to enhance the current drive ability, according to the inventors' examination, an effective approach is to increase the thicknesses of the front surface electrodes in the vertical direction. This is because the bump electrodes 102, 105 are formed on part of the front surface electrodes extending over the front surface of the semiconductor substrate 100 as shown in FIG. 13A and the amount of electric current components that flow in the front surface electrodes in the horizontal direction relative to the semiconductor substrate 100 is large. Increasing the thickness of the back surface electrode in the vertical direction is also an effective approach.

For this reason, a plating method is suitable as a method of manufacturing the front surface electrodes and the back surface electrode in order to increase the thicknesses of the front surface electrodes and the back surface electrode in the vertical direction.

In detail, a resist layer having openings in the regions for forming the front surface electrodes is formed on the front surface of the semiconductor substrate 100 first, and the front surface electrodes are formed in the openings by a plating method using the resist layer as a plating mask. The back surface electrode is formed on the whole back surface of the semiconductor substrate 100.

However, in the process of manufacturing the vertical MOS transistor, when the semiconductor substrate 100 is thinned, the semiconductor substrate 100 may warp due to the process of forming the back surface electrode 106 or a heat treatment process to cause the resist layer to have a formation defect such as peeling. This formation defect of the resist layer naturally causes the front surface electrode a formation defect.

Therefore, the invention is directed to forming a thick front surface electrode by a plating method to enhance the current drive ability of a transistor, and preventing a formation defect of a resist layer due to the warping of the semiconductor substrate 100.

SUMMARY OF THE INVENTION

The invention provides a semiconductor device that includes a semiconductor substrate having a front surface and a back surface, a first electrode layer covering the front surface of the semiconductor substrate, and a second electrode layer covering the back surface of the semiconductor substrate. The first electrode layer includes a first metal, and the second electrode layer includes a second metal. The first and second metals have substantially the same coefficient of linear expansion.

The invention also provides a method of manufacturing a semiconductor device. The method includes forming a first electrode layer on the front surface of a semiconductor substrate by a plating method, and forming a second electrode layer on the back surface of the semiconductor substrate by a physical vapor deposition method or a plating method. The first electrode layer includes a first metal, and the second electrode layer includes a second metal. The first and second metals have substantially the same coefficient of linear expansion.

The invention further provides another method of manufacturing a semiconductor device. The method includes forming a resist layer on a front surface of a semiconductor substrate, forming an opening in the resist layer, forming a first electrode layer in the opening of the resist layer on the front surface of the semiconductor substrate by a plating method using the resist layer as a mask, thinning the semiconductor substrate having the first electrode layer thereon from a back surface thereof, and forming a second electrode layer on the back surface of the thinned semiconductor substrate.

DETAILED DESCRIPTION OF THE INVENTION

A semiconductor device of an embodiment of the invention will be described referring to figures.

Figure 1A:
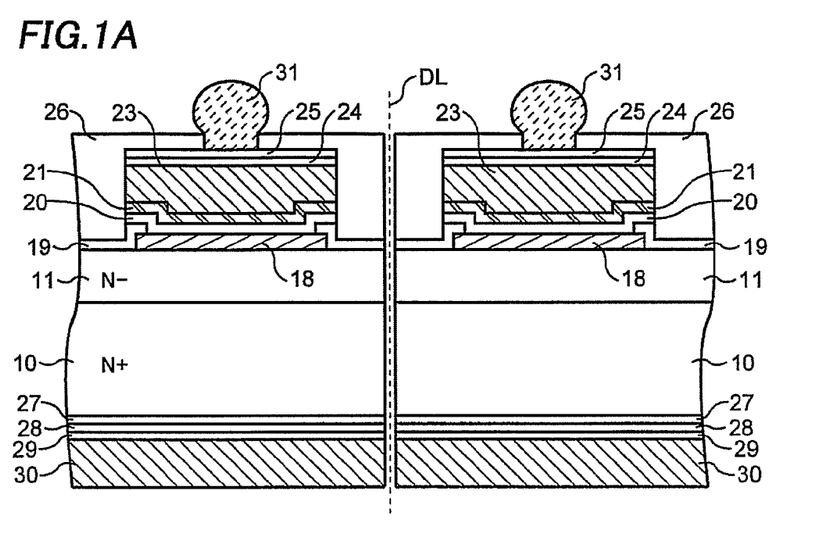
FIGS. 1A and 1B are cross-sectional views showing a semiconductor device of an embodiment of the invention.
Figure 1B:
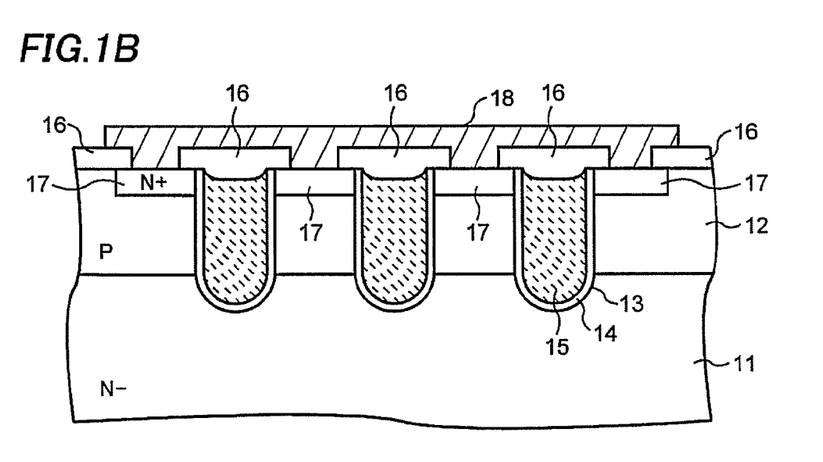

The description will be given on a semiconductor device that is a vertical MOS transistor in which a source-drain current flows in a direction vertical to a front surface of a semiconductor substrate. FIG. 1A is a cross-sectional view showing the structure of the vertical MOS transistor of the embodiment, showing the two vertical MOS transistors cut along a dicing line DL of a semiconductor substrate 10. FIG. 1B is a partial enlarged view showing the detailed structure of FIG. 1A from a source electrode connecting portion 18 to an N− type semiconductor layer. Those detailed structures, such as P type semiconductor layer 12, grooves 13, gate insulation films 14, gate electrodes 15, interlayer insulation film 16 and source regions 17 are omitted in FIG. 1A, for convenience of the description.

Figure 2A:
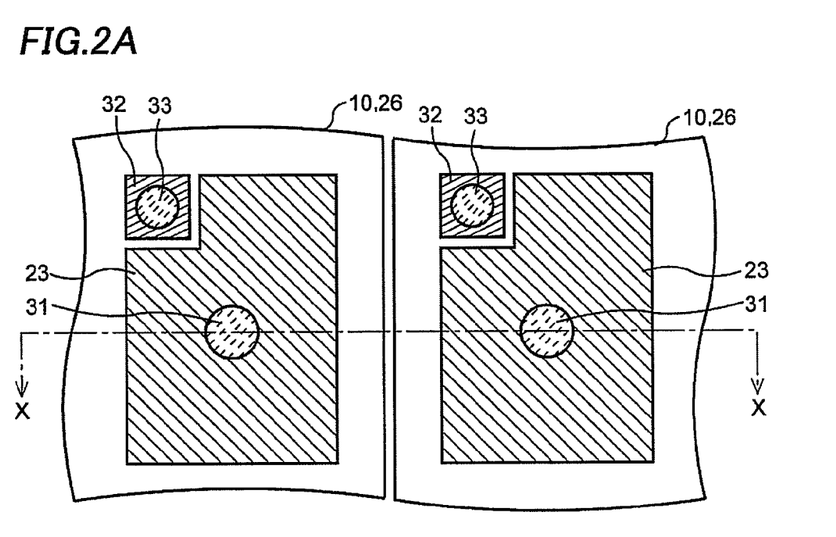
FIGS. 2A and 2B are plan views showing the semiconductor device of the embodiment of the invention.
Figure 2B:
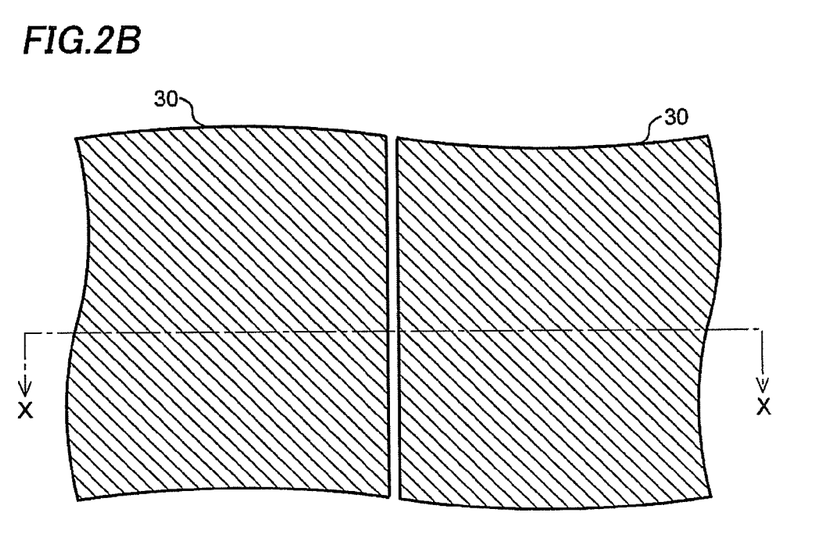

FIG. 1A corresponds to a cross-section of the vertical MOS transistors in FIGS. 2A and 2B of plan views along line X-X. FIG. 2A shows a configuration of front surface electrodes 23, 32 and so on of the vertical MOS transistors on the front surface side, and FIG. 2B shows a configuration of back surface electrodes 30 on the back surface side.

As shown in the figures, an N− type semiconductor layer 11 is formed on the front surface of the N+ type semiconductor substrate 10 by epitaxial growth. The source electrode connecting portion 18 is formed on the front surface of this N− type semiconductor layer 11, being connected to source regions 17 formed on the front surface. The source electrode connecting portion 18 is made of, for example, aluminum, and about 2 to 3 μm, for example.

Furthermore, a passivation film 19 made of a silicon nitride film or the like is formed on the front surface of the N− type semiconductor layer 11, covering the end portion of the source electrode connecting portion 18 and having an opening exposing part of the source electrode connecting portion 18. The front surface of the source electrode connecting portion 18 exposed in this opening is covered by a barrier layer 20 made of titanium or the like. A seed layer 21 made of copper is further layered on the barrier layer 20.

The front surface electrode 23 made of copper or silver is formed on this seed layer 21 by a plating method. The thickness of the front surface electrode 23 is, for example, about 5 μm or more, or preferably 10 to 20 μm. The upper surface of the front surface electrode 23 is covered by a plurality of plating layers, for example, a nickel plating layer 24 and a gold plating layer 25. The source electrode connecting portion 18, the front surface electrode 23, the nickel plating layer 24 and the gold plating layer 25 function as a source electrode. In the similar manner to the source electrode, as shown in FIGS. 1B and 2A, there is a gate electrode connecting portion (not shown) connected to gate electrodes 15, and the front surface electrode 32 is formed on the gate electrode connecting portion with a barrier layer 20 and a seed layer 21 being interposed therebetween. The upper surface of the front surface electrode 32 is covered by a nickel plating layer 24 and a gold plating layer 25, for example.

The front surface electrodes 23 and 32 together cover more than 70% of the front surface of the semiconductor substrate 10, as shown in FIG. 2A. The front surface electrode 23 alone may cover more than 70% of the front surface of the semiconductor substrate 10. Preferably, it covers more than 80% of the front surface of the semiconductor substrate 10.

Furthermore, the side surfaces of the front surface electrodes 23, 32, the side surfaces of the nickel plating layers 24, and the gold plating layers 25 are covered by a protection film 26 made of an organic resin. The protection film 26 has openings exposing the front surfaces of the gold plating layers 25, and bump electrodes 31, 33 for electrically connecting the front surface electrodes 23, 32 to a circuit board (e.g. a printed board) (not shown) are formed on the gold plating layers 25 exposed in the openings.

On the other hand, as shown in FIGS. 1A and 2B, the back surface electrode 30 made of copper or silver is formed on the back surface of the semiconductor substrate 10 by a plating method, being connected to the semiconductor substrate 10 forming a drain region. In this case, the back surface electrode 30 functions as a drain electrode. The back surface electrode 30 extends over the whole back surface of the vertical MOS transistor.

The back surface electrode 30 covers more than 90% of the back surface of the semiconductor substrate 10. It may cover the entire back surface of the semiconductor substrate 10.

The thickness of the back surface electrode 30 is, for example, about 5 μm or more, or preferably 10 to 20 μm. It is preferable that the front surface electrodes 23, 32 and the back surface electrode 30 are made of metals having substantially the same coefficients of linear expansion and the thicknesses are also the same or almost the same.

In this context, copper (Cu) having a coefficient of linear expansion of $16.8 \times 10^{-6}/°$ C. and silver (Ag) having a coefficient of linear expansion of $18.9 \times 10^{-6}/°$ C. have substantially the same coefficients of linear expansion.

With this structure, the amounts of thermal expansion of the front surface electrodes 23, 32 and the back surface electrode 30 when the vertical MOS transistor is used are the same or almost the same since these are made of the same materials. Therefore, stress applied to the interface between the semiconductor substrate 10 and the front surface electrodes 23, 32 and stress applied to the interface between the semiconductor substrate 10 and the back surface electrode 30 are the same or almost the same. Accordingly, the semiconductor substrate 10 is prevented from warping due to a difference between these stresses that has been seen conventionally. In detail, even when an environment temperature changes repeatedly, the protection film 26 and the bump electrodes 31, 33 are prevented from peeling, or the front surface electrodes 23, 32 and the back surface electrode 30 are prevented from peeling. As a result of this, the reliability of the semiconductor device is enhanced.

Furthermore, the effect described above is obtained more certainly by forming the front surface electrodes 23, 32 and the back surface electrode 30 having the same thicknesses or almost the same thicknesses since the amounts of thermal expansion of the front surface electrodes 23, 32 and the back surface electrode 30 become the same more certainly.

Hereafter, the structure of a main part of the vertical MOS transistor will be described in detail referring to FIG. 1B. A P type semiconductor layer 12 is formed on the front surface of the N− type semiconductor layer 11. A plurality of grooves 13 is formed from the front surface of the P type semiconductor layer 12 to a middle of the N− type semiconductor layer 11, and a gate electrode 15 made of polysilicon or the like is formed in each of the grooves 13 with a gate insulation film 14 made of a silicon oxide film or the like being interposed therebetween. The source regions 17 made of N+ layers are formed on the front surface of the P type semiconductor layer 12 on either side of each of the grooves 13. The upper surfaces of the gate electrodes 15 in the grooves 13 are covered by an interlayer insulation film 16 having openings on the source regions. The source electrode connecting portion 18 is formed so as to cover this interlayer insulation film, and connected to the source regions 17 through the openings of the interlayer insulation film 16. In this vertical MOS transistor, channel regions are formed in part of the P type semiconductor layer 12 on the sidewalls of the grooves 13, and the N– type semiconductor layer 11 and the semiconductor substrate 10 become a drain region.

In the structure described above, when a voltage at a threshold or higher is applied to the gate electrodes 15, the vertical MOS transistor turns on. Then, corresponding to a voltage (a source-drain voltage) applied to the front surface electrode 23 and the back surface electrode 30, a source-drain current flows.

Hereafter, a method of manufacturing the vertical MOS transistor described above will be described referring to FIGS. 3 to 11. FIGS. 3 to 11 show a region for forming the adjacent two vertical MOS transistors on either side of the dicing line DL.

Figure 3:
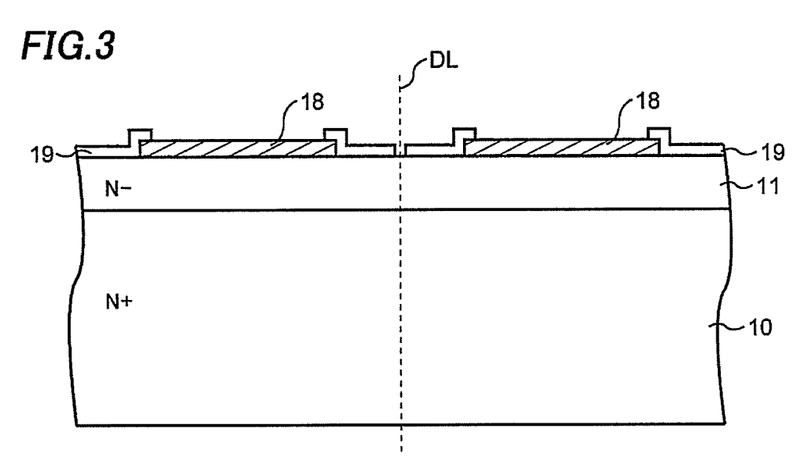
FIGS. 3 to 11 are cross-sectional views showing the semiconductor device and a method of manufacturing the same of the embodiment of the invention.

First, as shown in FIG. 3, the semiconductor substrate 10 made of N+ type single crystal silicon is provided, and the N– type semiconductor layer 11 is formed on the front surface thereof by epitaxial growth. At this time, the total thickness of the semiconductor substrate 10 and the N– type semiconductor layer 11 is, for example, about 500 to 700 µm.

The P type semiconductor layer 12 is formed on the front surface of the N– type semiconductor layer 11 as shown in FIG. 1B, and the plurality of grooves 13, the gate insulation films 14, the gate electrodes 15, the interlayer insulation film 16 and the source regions 17 are further formed. The P type semiconductor layer 12, the plurality of grooves 13, the gate insulation films 14, the gate electrodes 15, the interlayer insulation film 16 and the source regions 17 are omitted in FIGS. 3 to 11, for convenience of the description.

Then, the source electrode connecting portions 18 made of, for example, aluminum are formed on the P type semiconductor layer 12 formed on the front surface of the N– type semiconductor layer 11. At the same time, the gate electrode connecting portions are also formed. These source electrode connecting portions 18 and gate electrode connecting portions are formed by a sputtering method and a photolithography method. Then, the passivation film 19 made of a silicon nitride film or the like is formed on the N– type semiconductor layer 11 by an LPCVD method or the like, and the front surfaces of the source electrode connecting portions 18 and the gate electrode connecting portions are partially exposed by a photolithography method.

Figure 4:
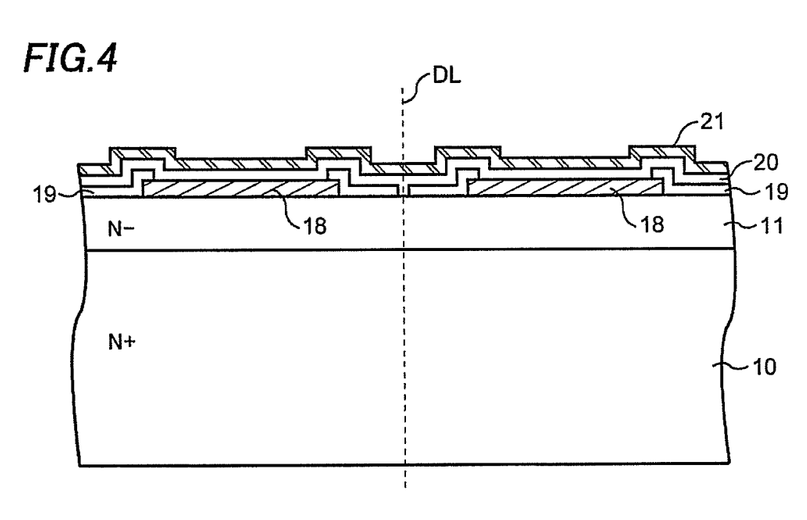

Then, as shown in FIG. 4, the barrier layer 20 made of titanium or the like is formed so as to cover the source electrode connecting portions 18, the gate electrode connecting portions and the passivation film 19. The barrier layer 20 functions as a barrier against copper diffused from the front surface electrodes 23, 32. The seed layer 21 made of copper is formed on the barrier layer 20, for use in a plating method that will be described below.

Figure 5:
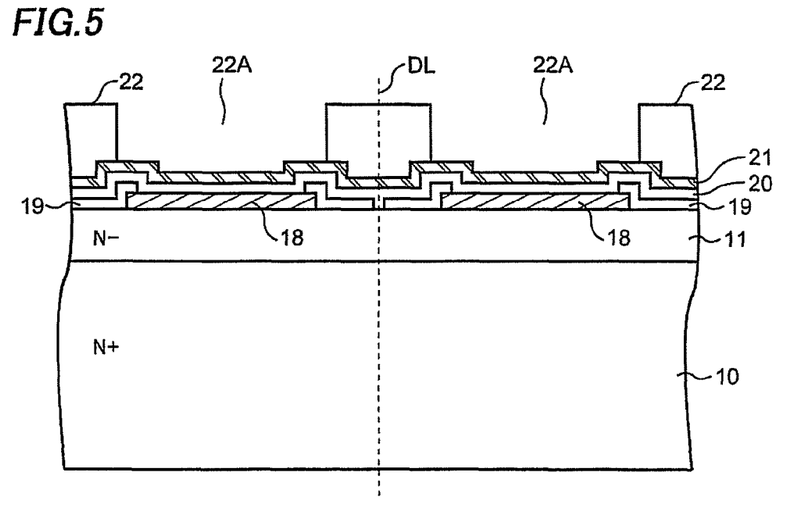

Then, as shown in FIG. 5, a resist layer 22 for plating is formed on the seed layer 21. The resist layer 22 has openings 22A exposing regions of the seed layer 21 that correspond to the regions for forming the front surface electrodes 23, 32 shown in FIG. 2A. This resist layer 22 is used as a plating mask in a process of forming the front surface electrodes 23, 32, i.e., a plating process that will be described below.

In the process of forming the resist layer 22, the material of the resist layer 22 is formed on the whole surface of the seed layer 21 first, and patterned so to have the openings 22A by a photolithography process, for example. Then, in order to harden the resist layer 22, a heat treatment, i.e. a baking treatment is performed to the resist layer 22 at a temperature of about 70° C. or more, or preferably about 90 to 130° C.

Figure 6:
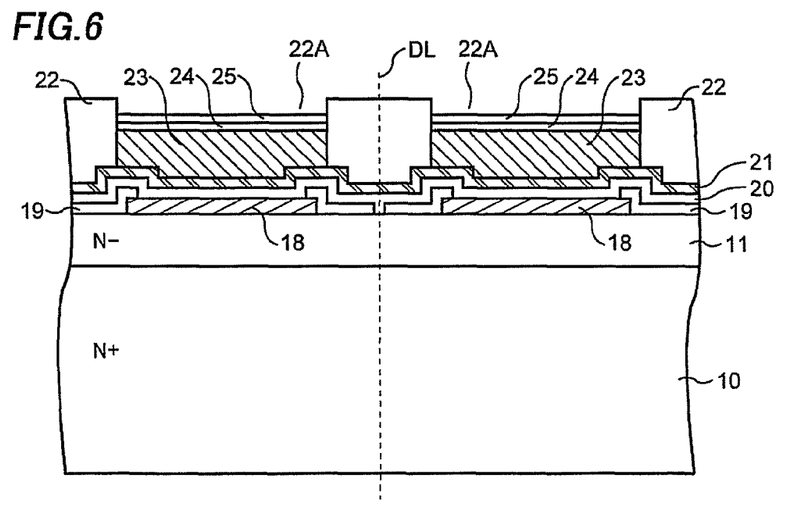

Then, as shown in FIG. 6, plating layers made of copper, i.e., the front surface electrodes 23, 32 are formed on the seed layer 21 in the openings 22A by a plating method using this resist layer 22 as a plating mask. Since these front surface electrodes 23, 32 are formed by the plating method, it takes shorter time than by other method such as a sputtering method. As the plating method for forming the front surface electrodes 23, 32, either one of an electrolytic plating process or an electroless plating process may be employed, but the electrolytic plating process is preferable in order to certainly obtain the thicknesses of the front surface electrodes 23, 32. The thicknesses of the front surface electrodes 23, 32 are about 5 µm or more, or preferably about 10 to 20 µm. The front surface electrodes 23, 32 may be plating layers made of silver.

Furthermore, according to needs, a plurality of plating layers, for example, the nickel plating layers 24 and the gold plating layers 25 are formed on the front surface electrodes 23, 32.

In this manner, since the front surface electrodes 23, 32 are formed thick in the vertical direction relative to the semiconductor substrate 10, electric current components flowing in the front surface electrodes 23, 32 in the horizontal direction relative to the semiconductor substrate 10 are increased. It means that the current drive ability of the vertical MOS transistor is enhanced.

Figure 7:
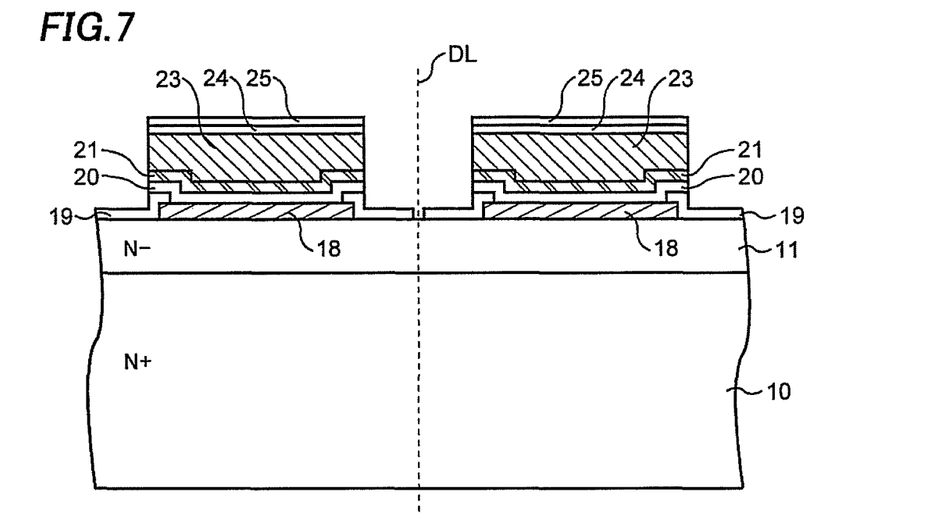

Then, as shown in FIG. 7, the resist layer 22 is removed. Furthermore, an unnecessary part of the barrier layer 20 and the seed layer 21, for example, a region that is not superposed on the front surface electrodes 23, 32 is removed by etching or the like.

Figure 8:
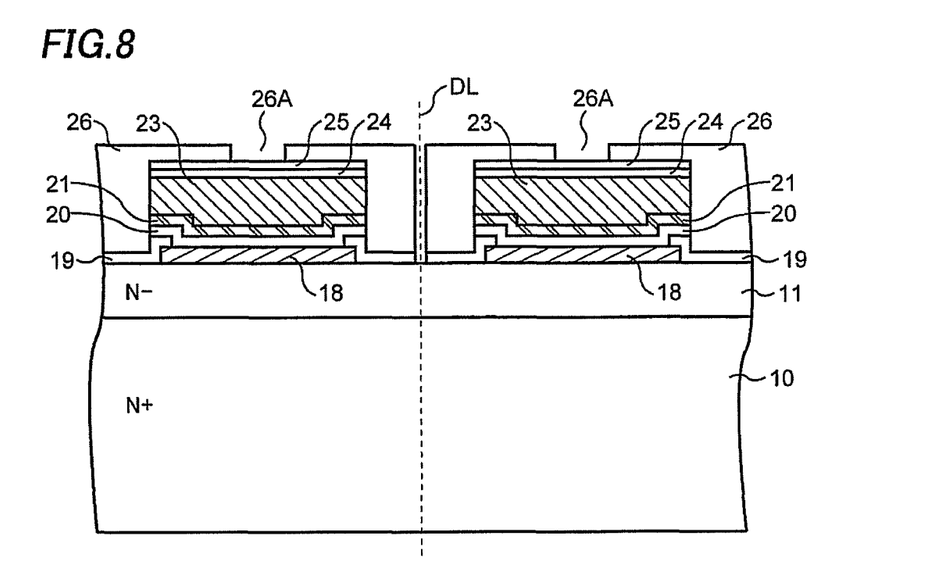

Then, as shown in FIG. 8, the protection film 26 made of an organic resin such as polyimide is formed so as to cover the side surfaces of the front surface electrodes 23, 32, the side surfaces of the nickel plating layers 24, and the gold plating layers 25. Openings 26A are provided in the protection film 26, exposing part of the gold plating layers 25. The openings 26A in the protection film 26 may be formed by removing the protection film in the regions for forming the openings by an etching method. When the protection film is made of a photosensitive organic resin, for example, the openings 26A are formed by a development treatment.

At this time, in order to harden the protection film 26, a heat treatment, i.e., a baking treatment is performed to the protection film 26 at a temperature of about 150° C. or more, or preferably about 200° C. or more.

It is preferable to remove a region of the protection film 26 along the dicing line DL at the same time as when the openings 26A are formed. This is to avoid peeling or damage of the protection film 26 due to contact with a dicing blade in a dicing process that will be performed last, as much as possible.

Furthermore, although the protection film 26 is formed so as to be in contact with the barrier layers 20, the seed layers 21, the front surface electrodes 23, 32, the nickel plating layers 24 and the gold plating layers 25 in the embodiment, the protection film 26 may be formed at a desired distance from these layers instead of being in contact therewith.

Figure 9:
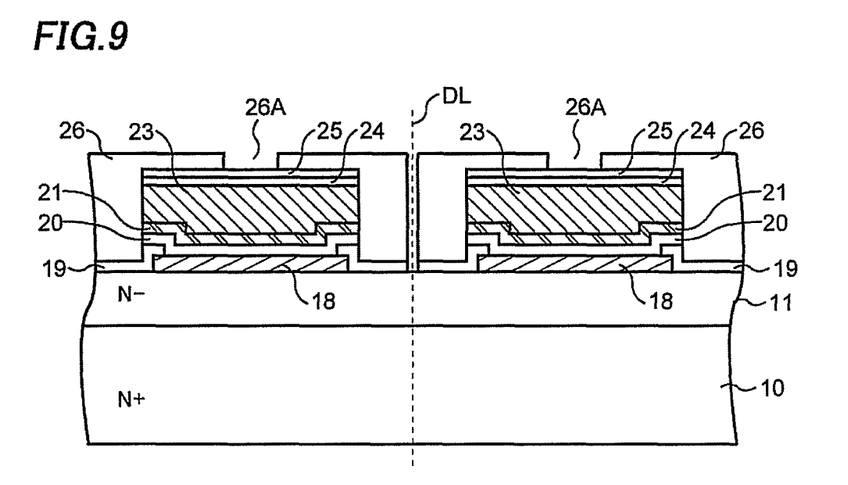

Then, as shown in FIG. 9, back-grinding is performed to the back surface of the semiconductor substrate 10 to thin the semiconductor substrate 10. The thickness of the semiconductor substrate 10 after the back-grinding is about 100 to 200 μm, for example, or preferably about 150 μm. The process of thinning the semiconductor substrate 10 may be performed by an etching method without limited to the grinding method described above.

Figure 10:
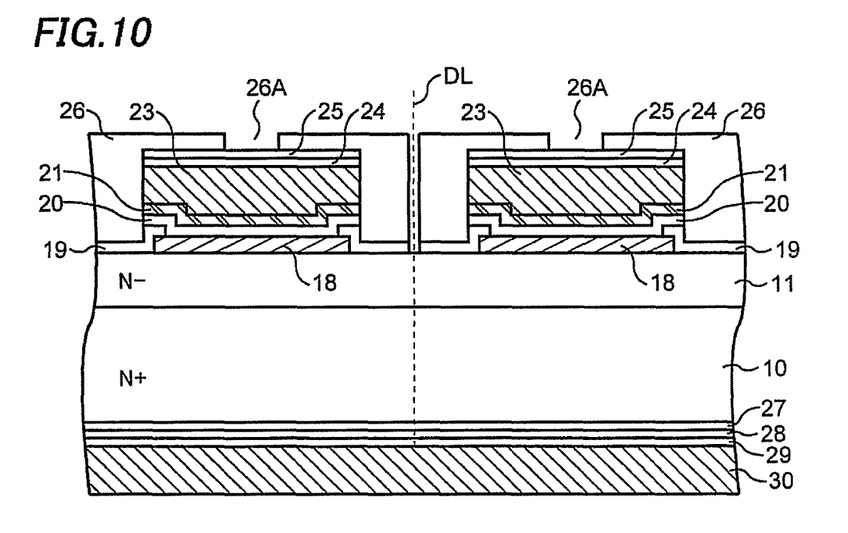

Then, as shown in FIG. 10, according to needs, a titanium layer 27 and a nickel layer 28 are formed on the whole back surface of the semiconductor substrate 10. Alternatively, only the titanium layer 27 may be formed thereon. Then, a seed layer 29 made of copper is formed on the titanium layer 27 and the nickel layer 28, or on the titanium layer 27. Then, the back surface electrode 30 made of copper or silver is formed on the seed layer 29 by a plating method. As this plating method, an electrolytic plating method is preferable, but an electroless plating method may be used.

It is noted that the back surface electrode 30 is not necessarily formed by the plating method and it may be formed by other method, for example, sputtering or a PVD (Physical Vapor Deposition) method such as vacuum evaporation instead. In this case, the seed layer 29 is not necessary.

Figure 11:
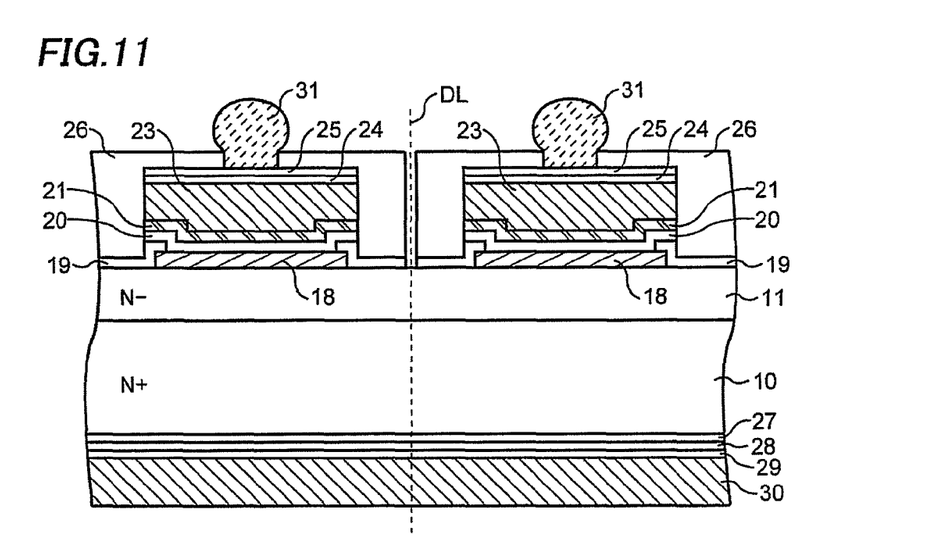

Then, as shown in FIG. 11, the bump electrodes 31, 33 for electrically connecting the front surface electrodes 23, 32 to a circuit board (e.g. a printed board) (not shown) are formed on the gold plating layers 25 in the openings 26A of the protection film 26. These bump electrodes 31, 33 are formed by reflowing a solder, for example. Then, the semiconductor substrate 10 and the layers layered thereon are cut by dicing along the dicing line DL to obtain the plurality of vertical MOS transistors.

By the processes described above, since the front surface electrodes 23, 32 are formed thick by the plating method, electric current components flowing in the front surface electrodes 23, 32 in the horizontal direction relative to the semiconductor substrate 10 are increased. It means that the current drive ability of the vertical MOS transistor is enhanced.

Furthermore, by performing the process of forming the front surface electrodes 23, 32 before the semiconductor substrate 10 is thinned, the semiconductor substrate 10 is prevented from warping due to heat in the baking treatment of the plating resist layer 22 for forming the front surface electrodes 23, 32 by the plating method. If the front surface electrodes 23, 32 are formed by the plating method after the semiconductor substrate 10 is thinned and the thick back surface electrode 30 is formed, the semiconductor substrate 10 warps since the amounts of thermal expansion of the semiconductor substrate 10 and the back surface electrode 30 in the baking treatment of the resist layer 22 used as the plating mask differ due to the difference in coefficient of linear expansion between the semiconductor substrate 10 and the back surface electrode 30.

Furthermore, the process of forming the protection film 26 is also performed before the semiconductor substrate 10 is thinned and the back surface electrode 30 is formed. This prevents the semiconductor substrate 10 from warping by the baking treatment of the protection film 26 due to the difference in coefficient of linear expansion between the semiconductor substrate 10 and the back surface electrode 30.

Furthermore, since the process of forming these front surface electrodes 23, 32 and the protection film 26 is performed before the semiconductor substrate 10 is thinned i.e., in the state where the semiconductor substrate 10 is thick and its mechanical strength is large, the semiconductor substrate 10 is prevented from warping more certainly.

Figure 12:
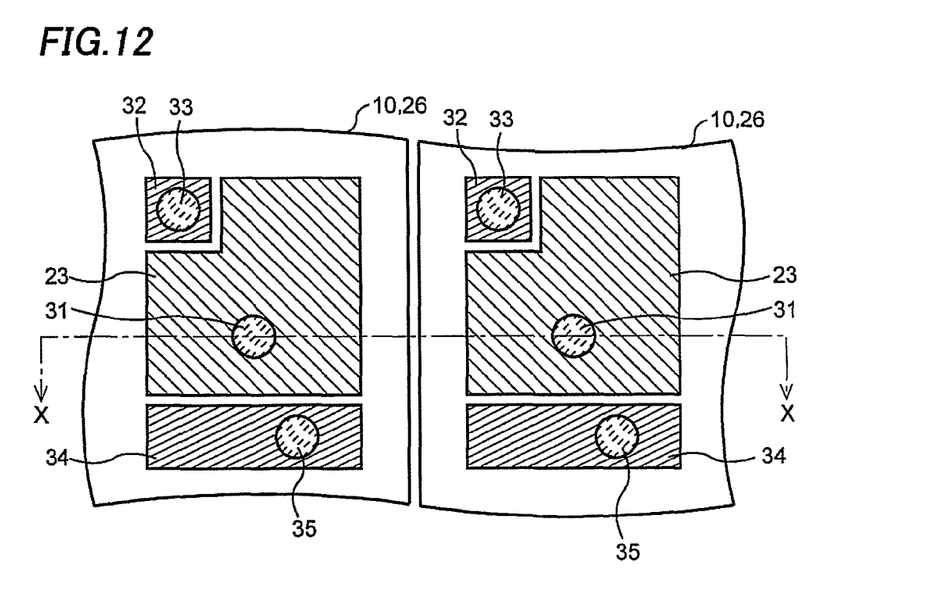
FIG. 12 is a plan view showing the semiconductor device of the embodiment of the invention.

Furthermore, as shown in the plan view of FIG. 12, as a so-called up-drain structure, front surface electrodes 34 as drain electrodes may be formed on the front surface of the semiconductor substrate 10, being electrically connected to the semiconductor substrate 10 forming the drain region of the vertical MOS transistor. Then, bump electrodes 35 each for electrically connecting the front surface electrode 34 to a circuit board (e.g. a printed board) (not shown) are formed on the front surface electrodes 34. The other structure is the same as the structure shown in FIGS. 1A to 11.

As described above, in the invention, when the thick front surface electrodes 23, 32, 34 are formed on a most part of the front surface of the semiconductor substrate 10, and the thick back surface electrode 30 is formed on the whole back surface, the thicknesses of these electrodes on both the surfaces are almost equalized. Therefore, the semiconductor substrate 10 is prevented from warping. Furthermore, since the semiconductor substrate is thinned from the back surface side after the thick front surface electrodes 23, 32, 34 and protection film 26 are formed on the front surface of the semiconductor substrate 10, it is not necessary to attach a support substrate such as a glass board on the front surface of the semiconductor substrate 10 and the manufacturing process is simplified.

In the embodiment, the thicknesses of the front surface electrodes 23, 32, 34 and the back surface electrode 30 are the same or almost the same. This is because the total area of the front surface electrodes 23, 32 or the front surface electrodes 23, 32, 34 and the area of the back surface electrode 30 are almost the same. The semiconductor substrate 10 is thus prevented from warping by equalizing the thicknesses of the electrodes on both the surfaces. However, from an aspect of a need to equalize the amounts of thermal expansion, the electrodes on both the surfaces may be formed to have the same volume or almost the same volume.

Furthermore, the materials of the electrodes on both the surfaces are not necessarily the same and various settings are possible as long as the amounts of thermal expansion are equalized.

The invention is not limited to the embodiment described above, and a modification is possible within the scope of the invention. For example, although the description of the embodiment is given using an N channel type vertical MOS transistor as an example, a P channel type vertical MOS transistor may be used instead.

As a result, the reliability of a semiconductor device is increased since the warping of the semiconductor device due to heat is prevented when it is used.

Furthermore, a thick first electrode (the front surface electrode) is formed by performing a plating method before a semiconductor substrate is thinned so as to increase an electric current flowing through a transistor and prevent the semiconductor substrate from warping due to heat by a baking treatment of a plating resist layer in a plating process. This prevents the resist layer a formation defect such as peeling due to the warping of the semiconductor substrate.

What is claimed is:

1. A semiconductor device comprising: a semiconductor substrate having a front surface and a back surface; a vertical field-effect transistor including a source region, a drain region, and a gate electrode; a first electrode covering more than 70% of the front surface of the semiconductor substrate and coupled to the source region; a second electrode covering a portion of the front surface of the semiconductor substrate and spaced apart from the first electrode, wherein the second electrode is coupled to the gate electrode; and a third electrode covering more than 90% of the back surface of the semiconductor substrate and coupled to the drain region, wherein each of the first electrode and the second electrode has a first set of electrode layers including a first electrode layer; the third electrode has a second set of electrode layers that has a composition that is different from the first set of electrode layers, wherein the third electrode includes a second electrode layer; and the first electrode layer and the second electrode layer have the same amount of thermal expansion and the thicknesses of the first electrode layer and the second electrode layer are sufficient to prevent warping of the semiconductor device.

2. The semiconductor device of claim 1, wherein a thickness of the first electrode layer is between 5 µm and 20 µm, and a thickness of the second electrode layer is between 5 µm and 20 µm.

3. The semiconductor device of claim 2, wherein thicknesses of the first electrode layer and the second electrode layer are different.

4. The semiconductor device of claim 2, further comprising an electrode connecting portion and a passivation film, wherein:
the electrode connecting portion electrically connects the source region to the first electrode, and the electrode connecting portion directly contacts the first electrode;
a portion of the passivation film directly overlies a portion of the electrode connecting portion, and a portion of the first electrode directly overlies the portion of the electrode connecting portion; and
the electrode connecting portion comprises aluminum.

5. The semiconductor device of claim 2, wherein:
the first set of electrode layers further comprises a first barrier layer and a first seed layer disposed between the first electrode layer and the substrate; and
the second set of electrode layers further comprises a second barrier layer and a second seed layer disposed between the second electrode layer and the substrate.

6. The semiconductor device of claim 5, wherein each of the first and second barrier layer comprises titanium, and each of the first and second seed layers comprises copper.

7. The semiconductor device of claim 1, further comprising a passivation film in direct contact with the front surface of the semiconductor substrate.

8. The semiconductor device of claim 1, wherein the first electrode layer and the second electrode layer are both copper layers or are both silver layer.

9. The semiconductor device of claim 5, wherein the second set of electrode layers further comprises a third electrode layer having a third electrode layer composition, and the first set of electrode layers does not include an electrode layer having the third electrode layer composition.

10. The semiconductor device of claim 5, wherein the second set of electrode layers includes a nickel layer that is disposed between the second barrier layer and the second seed layer, and the first set of electrode layers does not include a nickel layer disposed between the first barrier layer and the first seed layer.

11. The semiconductor device of claim 2, further comprising a lightly doped semiconductor layer and an electrode connecting portion, wherein:
the lightly doped semiconductor layer overlies the substrate;
the electrode connecting portion is electrically connected to the first electrode and forms a Schottky contact with the lightly doped semiconductor layer.

12. A semiconductor device comprising:
a semiconductor substrate having a front surface and a back surface;
a vertical field-effect transistor including a source region, a drain region, and a gate electrode within a trench;
a first electrode covering more than 70% of the front surface of the semiconductor substrate and electrically connected to the source region;
a second electrode covering a second part of the front surface of the semiconductor substrate not covered by the first electrode, wherein the second electrode is electrically connected to the gate electrode; and
a third electrode covering the back surface of the semiconductor substrate and electrically connected to the drain region,
wherein:
each of the first electrode and the second electrode has a first set of electrode layers including a first electrode layer;
the third electrode has a second set of electrode layers that has a composition that is different from the first set of electrode layers, wherein the third electrode includes a second electrode layer; and
a first stress between the semiconductor substrate and each of the first and second electrodes and a second stress between the semiconductor substrate and the third electrode are almost the same.

13. The semiconductor device of claim 12, wherein the third electrode includes a layer between a seed layer and a barrier layer, and each of the first electrode and the second electrode has a seed layer in direct contact with a barrier layer.

14. The semiconductor device of claim 13, wherein the third electrode includes a Ni layer disposed between the barrier layer and the seed layer of the third electrode.

15. The semiconductor device of claim 12, wherein the first electrode layer and the second electrode layer have the same composition and thicknesses sufficient to prevent warping of the semiconductor device.

16. The semiconductor device of claim 12, wherein the first electrode layer and the second electrode layer are both copper layers or are both silver layers.

17. A semiconductor device comprising:
semiconductor substrate having a front surface and a back surface;
a first electrode covering more than 70% of the front surface of the semiconductor substrate;
a second electrode covering a portion of the front surface of the semiconductor substrate not covered by the first electrode; and
a third electrode covering the backside of the semiconductor substrate,
wherein:
each of the first electrode and the second electrode has a first set of electrode layers including a first electrode layer;
the third electrode has a second set of electrode layers that has a composition that is different from the first set of electrode layers, wherein the third electrode includes a second electrode layer; and
the first electrode layer has the same composition and an almost equal thickness as the second electrode layer; and
a first stress between the semiconductor substrate and a combination of the first and second electrodes, and a second stress between the semiconductor substrate and the third electrode are almost the same.

18. The semiconductor device of claim 17, wherein:
- each of the first electrode and the second electrode has a first set of electrode layers including a first electrode layer;
- the third electrode has a second set of electrode layers that is different from the first set of electrode layers, wherein the third electrode includes a second electrode layer; and
- the first electrode layer and the second electrode layer have the same coefficient of thermal expansion and different thicknesses.

19. The semiconductor device of claim 17, wherein the first electrode layer and the second electrode layer are both copper layers or are both silver layers.

20. The semiconductor device of claim 17, further comprising a vertical field-effect transistor including a source region, a drain region, and a gate electrode within a trench, wherein the first electrode is coupled to the source region, the second electrode is coupled to the gate electrode, and the third electrode is coupled to the drain region.

* * * * *